United States Patent
Seitz et al.

(10) Patent No.: US 6,518,084 B1
(45) Date of Patent: Feb. 11, 2003

(54) METHOD OF PRODUCING A MICROMECHANICAL STRUCTURE FOR A MICRO-ELECTROMECHANICAL ELEMENT

(75) Inventors: Stefan Seitz, Planegg (DE); Leonhard Hoefter, Munich (DE); Juergen Kruckow, Munich (DE); Karl Neumeier, Unterhaching (DE); Dieter Bollmann, Munich (DE)

(73) Assignee: Fraunhofer-Gesellschaft zur Foerderung der angewandten Forschung e.V., Munich (DE)

( * ) Notice: Subject to any disclaimer, the term of this patent is extended or adjusted under 35 U.S.C. 154(b) by 0 days.

(21) Appl. No.: 09/868,402

(22) PCT Filed: Sep. 29, 1999

(86) PCT No.: PCT/EP99/07206
§ 371 (c)(1),
(2), (4) Date: Sep. 12, 2001

(87) PCT Pub. No.: WO00/36385
PCT Pub. Date: Jun. 22, 2000

(30) Foreign Application Priority Data

Dec. 15, 1998 (DE) .......................................... 198 57 741
Jun. 18, 1999 (DE) .......................................... 199 27 971

(51) Int. Cl.[7] ........................ H01L 21/00; G01P 15/125; G01F 1/38
(52) U.S. Cl. .................... 438/53; 73/514.32; 73/861.47
(58) Field of Search ..................... 438/52, 53; 73/724, 73/718, 721, 514.32, 861.47; 57/419; 361/283.3, 283.4

(56) References Cited

U.S. PATENT DOCUMENTS

| | | | | | |
|---|---|---|---|---|---|
| 4,023,562 A | * | 5/1977 | Hynecek et al. | ........... | 128/2.05 |
| 4,998,179 A | * | 3/1991 | Grantham et al. | ........... | 361/283 |
| 5,744,725 A | * | 4/1998 | Chen et al. | .................... | 73/724 |
| 5,946,549 A | * | 8/1999 | Itoigawa et al. | ............... | 438/53 |
| 6,140,144 A | * | 10/2000 | Najafi et al. | ................... | 438/53 |

FOREIGN PATENT DOCUMENTS

| | | | | |
|---|---|---|---|---|
| DE | 3743080 | | 12/1987 | ............. G01L/9/06 |
| DE | 3115420 A1 | * | 11/1992 | |
| DE | 19543893 | | 11/1995 | ............ H01L/21/30 |
| DE | 19913612 | | 3/1999 | ......... H01L/23/544 |
| FR | 0 639 761 A1 | * | 6/1994 | |

* cited by examiner

Primary Examiner—John F. Niebling
Assistant Examiner—Viktor Simkovic
(74) Attorney, Agent, or Firm—Michael A. Glenn

(57) ABSTRACT

In a method of producing a micromechanical structure for a micro-electromechanical element, a first intermediate layer, which is applied to a first main surface of a first semiconductor wafer, is structured in a first step so as to produce a recess. The first semiconductor wafer is then connected via the first intermediate layer to a second semiconductor wafer in such a way that a hermetically sealed cavity is defined by the recess. Finally, one of the wafers is thinned from a surface facing away from said first intermediate layer so as to produce a diaphragm-like structure on top of the cavity. At least one further intermediate layer is provided between the two semiconductor wavers which, prior to the connection of the two semiconductor wafers, is structured in such a way that the structure formed in said at least one further intermediate layer and the recess in said first intermediate layer define the cavity.

12 Claims, 3 Drawing Sheets a)

b)

c)

METHOD OF PRODUCING A MICROMECHANICAL STRUCTURE FOR A MICRO-ELECTROMECHANICAL ELEMENT

BACKGROUND OF THE INVENTION

1. Field of the Invention

The present invention relates to a method of producing a micromechanical structure for a micro-electromechanical element, and, more specifically, to a method of producing a diaphragm-like structure in a semiconductor wafer in which an integrated circuit is to be produced later on making use of conventional standard semiconductor processes.

2. Description of Prior Art

Due to the fast development in the field of semiconductor industry and microelectronics, micromechanical elements, e.g. silicon-based micromechanical pressure measurement cells, replace classical mechanical pressure transducers more and more. Micromechanical elements are used in great amounts e.g. in the fields of automation technology and medical engineering as well as in automotive vehicles. The systems preferably used in this connection are micro-electromechanical integrated systems which realize the combination of mechanical and electronic functions on one substrate. In addition to the electronic components produced in CMOS or similar technologies, which are e.g. measuring transducers, amplifiers, storage means, microcontrollers, etc., mechanical components exist in the same layers. These mechanical components may e.g. be diaphragms of pressure sensors, elastic sheets of valves or pumps, oscillating masses of acceleration sensors, movable fingers or cantilevered arms of switches and the like. In addition to the more or less smooth surface which normally exists in the field of planar technology, these mechanical structures have a three-dimensional structural design and comprise cantilevered structures and buried cavities.

Up to now, it has been known to produce such cavities by wet-chemical etching or by connecting two disks which have been fully processed individually in advance. The techniques which may be used as a connection technique for connecting the individually processed disks are wafer bonding (silicon fusion bonding), anodic bonding or glueing. In any case, the individual disks are fully processed before they are connected in accordance with conventional methods, so that processing steps which may impair the mechanical structures need not be carried out afterwards.

When a wet-chemical undercutting of structures is carried out, the so-called "sticking" problem arises in the case of which the cantilevered structure will adhere to the neighbouring surface due to capillary forces occurring when the liquid dries; hence, the cantilevered structure will lose its movability. Small ditches, holes and gaps additionally cause problems when the structure in question is to be wetted with liquids (e.g. etching solutions, cleaning water, photoresist) and during the removal of these liquids, the problems being then caused e.g. by bubbles which may adhere to the structure in corners thereof. In the case of spinning, drops may remain, which will cause marks when they dry up. Cleaning by means of brushes is problematic as well, since the movable structures may break off during such cleaning processes. A clean surface of the structures is, however, necessary so that the production methods for producing the evaluation structures, such as a CMOS method, can be applied. Due to the risk of carrying over particles and contaminations, the CMOS ability may no longer be given in the case of open structures, i.e. certain sequences of process steps are not allowed in an CMOS line. In addition, when the chips comprised in the wafer are diced by means of a wafer saw, water is used as a rinsing liquid, which may penetrate into open cavities thus aggravating the particle and contamination problem.

It is additionally known to produce diaphragm-like structures making use of KOH back etching, when the electronic components on the front surface of a wafer have been finished. Due to the oblique etch edges occurring in the case of KOH etching, the integration level will, however, decrease substantially when this method is used, especially when a high number of micro-electromechanical components is produced from one wafer.

Various methods of producing semiconductor pressure sensors are additionally described in DE 3743080 A1.

DE-C-19543893 describes a method of aligning structures which are to be produced in a substrate, in the case of which a diaphragm-like structure is formed on top of a cavity. For this purpose, a closed cavity is first produced between two substrates by forming a recess in a masking layer on one of the substrates, whereupon the two substrates are interconnected via the masking layer and one of the substrates is thinned in a final step.

EP-A-639761 discloses a method of producing a differential pressure sensor in the case of which a substrate structure, in which a micromechanical element is formed, is connected to a glass substrate.

EP-A-702221 describes a method of producing a micromechanical structure and an integrated circuit in one component, the integrated circuit being produced in a first step making use of CMOS processes and the micromechanical structure, which consists of a cavity and a diaphragm, being implemented after the production of the integrated circuit.

SUMMARY OF THE INVENTION

It is the object of the present invention to provide a method of producing a micromechanical structure and a micromechanical element, which permit the use of conventional standard processes for producing evaluation circuits in the same substrate in which the micromechanical structure is formed, the method permitting a high yield to be achieved for the resultant micro-electromechanical elements and the micromechanical stucture being adapted to be used in a flexible manner.

This object is achieved by a method of producing a micromechanical structure for a micro-electromechanical element in the case of which a first intermediate layer, which is applied to a first main surface of a first semiconductor wafer, is structured in a first step so as to produce a recess. Subsequently, the first semiconductor wafer is connected via the first intermediate layer to a second semiconductor wafer in such a way that a hermetically sealed cavity is defined by the recess. Then, one of the wafers is thinned from a surface facing away from the first intermediate layer so as to produce a diaphragm-like structure on top of the cavity. At final version least one further intermediate layer is provided between the two semiconductor wavers which, prior to the connection of the two semiconductor wafers, is structured in such a way that the structure formed in said at least one further intermediate layer and the recess in said first intermediate layer define the cavity.

In the case of the micromechanical structure produced in this way, in which the cavity remains hermetically sealed after the thinning of one of the wafers, an integrated circuit can now be integrated in the thinned wafer making use of conventional standard semiconductor production processes. In the course of these processes, the cavity which, together with the diaphragm-like structure, defines the micromechanical element will always remain hermetically sealed so that the above-described problems entailed by the use of e.g. an CMOS method for producing an integrated circuit will not arise when the method according to the present invention is used. In addition, in view of the hermetically sealed cavity, the above-mentioned problems of removing the etching liquids from the cavities will not arise, since, due to the fact that the cavities are hermetically sealed, it is impossible that media, such as liquids, gases, solids and the like, penetrate into the respective cavity during the production of the integrated circuit. It follows that the method of producing a micromechanical structure according to the present invention permits micro-electromechanical elements, e.g. pressure sensors or controlled valves, to be produced by a reduced number of processing steps so that production at a reasonable price is made possible by the present invention.

According to the present invention, these advantages are achieved in that a hermetically sealed cavity is formed in an intermediate layer which is used for connecting two semiconductor wafers. According to preferred embodiments of the present invention, both semiconductor wafers have an intermediate layer applied thereto, one or both of these intermediate layers being structured so as to form the cavity after the connecting step; the intermediate layers are insulating or conductive layers which may consist e.g. of oxide (thermal or TEOS), polysilicon, nitride or metal. These intermediate layers can be interconnected by means of known connection methods, e.g. wafer bonding (silicon fusion bonding), anodic bonding or by means of an adhesive. Alternatively, a larger number of intermediate layers can be used between the wafers to be connected so as to permit the production of a cavity with areas of variable height.

The micromechanical structures produced according to the present invention are particularly suitable for use in pressure sensors, e.g. absolute pressure sensors or differential pressure sensors. In addition, the method according to the present invention can be used for producing micromechanical structures comprising a plurality of independent diaphragm areas so that a pressure sensor array can be produced in this way. The present invention can, however, also be used for providing micromechanical structures for use in other micro-electromechanical components, e.g. elastic sheets of valves or pumps, oscillating masses of acceleration sensors, movable fingers or cantilevers of micromechanical relays and the like.

Further developments of the present application are specified in the dependent claims.

BRIEF DESCRIPTION OF THE DRAWINGS

In the following, preferred embodiments of the present invention will be explained in detail making reference to the drawings enclosed, in which.

Figure 1:
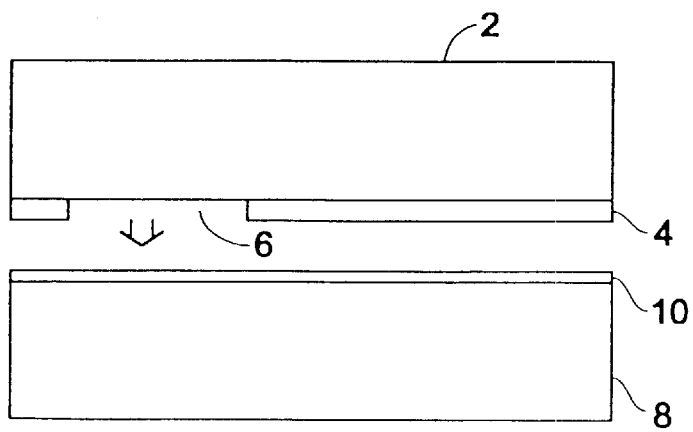
FIGS. 1a) to 1c) show schematic cross-sectional views for explaining an embodiment of the method according to the present invention.
Figure 1:
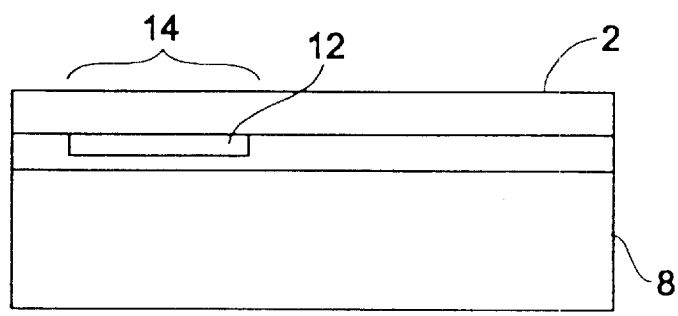
Figure 1:
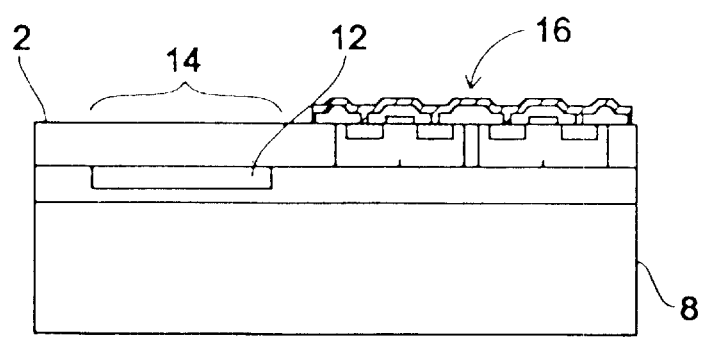

DESCRIPTION OF PREFERRED
EMBODIMENTS OF THE INVENTION

Making reference to FIGS. 1a) to 1c), a preferred embodiment of the method of producing a micromechanical element according to the present invention will be explained in the following, the method being used for producing the micromechanical structure of a pressure sensor and, subsequently, for producing an integrated circuit in the substrate in which the diaphragm of the pressure sensor is formed.

As can be seen in FIG. 1a), an intermediate layer 4, which is applied to a first semiconductor wafer 2, is first structured so as to form a recess 6 therein. Subsequently, the semiconductor wafer 2 is connected via the intermediate layer 4 to a second semiconductor wafer 8 which, in the case of the embodiment shown, is also provided with an intermediate layer 10. Due to the connection of the two wafers 2 and 8, a heretically sealed cavity 12 is defined by the recess 6, as can be seen in FIG. 1b). When the two wafers 2 and 8 have been connected, the first wafer 2 is thinned from its main surface facing away from the wafer 8 so as to produce a diaphragm-like structure 14 on top of the cavity 12. In the course of this process, the cavity 12 defined in the intermediate layer 4 remains hermetically sealed.

FIG. 1b) shows the micromechanical structure produced by the method according to the present invention; the production method of this micromechanical structure permits integrated circuit structures 16 to be produced in the thinned wafer 2 by means of conventional standard semiconductor processes, the thinned wafer 2 having the diaphragm-like structure 14 formed therein; these integrated circuit structures can be used for evaluating signals that have been produced by the diaphragm 14. The micromechanical structure becomes in this way the micro-electromechanical structure shown in FIG. 1c) in the case of which a semiconductor wafer 2 has formed therein a micromechanically produced diaphragm 14 as well as an integrated circuit 16 which has been produced e.g. by conventional CMOS techniques. The method for producing a micromechanical structure according to the present invention permits this production of a micro-electromechanical element making use of conventional standard semiconductor production processes, e.g. CMOS processes, since the cavity 12 always remains hermetically sealed until the integrated circuit has been finished. It follows that the present invention permits an economy-priced production of micro-electromechanical elements by means of a—in comparison with conventional methods—reduced number of method steps.

The material used for the semiconductor wafers in the method according to the present invention is preferably silicon, the intermediate layer or the intermediate layers 4 and 10 in FIG. 1 consisting preferably of an oxide (thermal or TEOS), polysilicon, a nitride or metal. In this respect, it should be pointed out that, although an intermediate layer is arranged on both wafers of the above-described embodiment, the method according to the present invention requires only one intermediate layer in which the recess is structured. According to alternative embodiments, a plurality of intermediate layers can be provided between the wafers so that it will be possible to produce cavities with areas of different heights by structuring the individual layers differently. Alternatively to the method shown in FIG. 1, it would also be possible to provide a structure also in the intermediate layer 10 applied to the second substrate 8, so that this structure will, together with the structure provided in the intermediate layer 4, define the cavity when the wafers have been connected. Reference should be made to the fact that a quasi-unlimited possibility of structuring intermediate layers for producing different cavities exists as long as the cavities are hermetically sealed after the connection of the two wafers. The structuring for producing these cavities can be carried out by means of known structuring techniques, e.g. photolithography, wet etching or dry etching, or by means of selective deposition.

Figure 3:
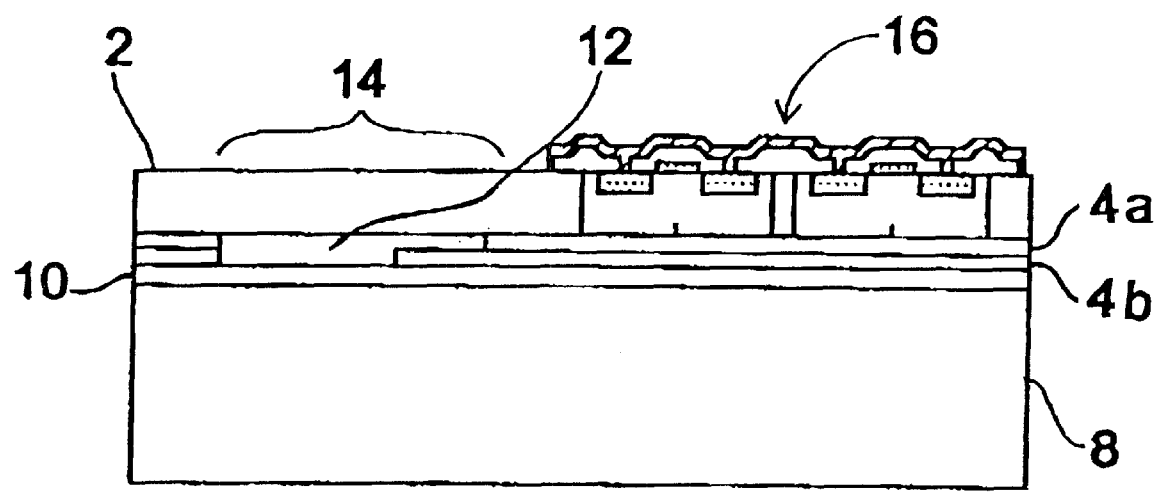
FIG. 3 shows a cross-sectional view showing a cavity with variable height.

An example of a micromechanical structure having a cavity 12 with areas of variable height is shown in FIG. 3. To this end, two structured intermediate layers 4a and 4b are provided between the thinned wafer 2 and the wafer 8.

The wafers can be connected by means of known connection methods; the two wafers are placed one on top of the other such that they are in contact via the connection layer or connection layers, and interconnected by means of special processes, e.g. anodic bonding processes, adhesive processes or the so-called silicon fusion bonding. When this connection has been established, a hermetically sealed cavity 12 is formed by the recess or the recesses which have initially been structured in the intermediate layer or in the intermediate layers, this cavity being shown in FIG. 1b). Subsequently, one of the two semiconductor wafers is thinned to a predetermined thickness so that a diaphragm-like structure is formed on top of the cavity. The wafer to be thinned can preferably consist of an SOI material (silicon on insulator), which will facilitate exact thinning. By means of this thinning, a sensor-specific zone or diaphragm is produced on top of the structured areas, i.e. on top of the cavities, whereas the residual area of the thinned wafer can be used for the integration of electronic circuits.

The mechanical structures produced according to this method—one of these structures being shown in FIG. 1b) by way of example—still have a planar surface which is closed at the top and below this surface one or a plurality of hermetically sealed cavities. Hence, the thinned wafer can be processed by the conventional CMOS technologies.

The shape of these hermetically sealed cavities has an arbitrary plan area, in the simplest case rectangular, polygonal or round, and it may comprise elongate and convolute channels or it may consist of a plurality of isolated structures or structures which are connected with channels. The height of the cavities is given by the thickness of the structured layer, as can be seen in FIG. 1a; hence, this height will be uniform in the simplest case. As has already been mentioned hereinbefore, the height of the cavities can, however, be varied in an arbitrary manner by structuring a single layer more than once or by structuring several layers, i.e. cavities with areas of different heights can be produced.

In accordance with preferred embodiments of the method of producing a micromechanical structure according to the present invention, the step of connecting the two wafers is carried out in a vacuum so that in the case of high-temperature processes which may perhaps be carried out later on no excess pressure will result from the thermal expansion of a gas contained in the hermetically sealed cavities. This will prevent the diaphragm-like structures produced on top of the cavity or cavities from being damaged, since it is easier to resist e.g. a negative pressure of 1 bar in the cold condition, which exists e.g. in the case of a vacuum in the cavity, than an excess pressure of 3 bar in a diffusion furnace at e.g. 1100° C., when the connection of the wafer does not take place in a vacuum. Depending on the respective use of the micromechanical structure produced according to the present invention it is, however, also possible to fill the cavity with a special gas at an arbitrary pressure.

The method of producing a micromechanical structure according to the present invention is particularly suitable for producing micromechanical parts of various pressure sensors. The sensor signal of such pressure sensors can be produced in different ways, e.g. by means of integrated piezoelectric resistors on, in or at the side of the diaphragm produced according to the present invention, or by means of capacitive measurement methods by attaching a movable electrode to the diaphragm and by means of a complementary counterelectrode. When, making use of the method of producing a micromechanical structure according to the present invention, the micro-electromechanical elements have been finished, the elements, which are still comprised in the wafer, can be diced so as to produce individual sensor elements. FIG. 1c), for example, shows an absolute pressure sensor in the case of which the cavity 12 remains hermetically sealed so that a pressure acting on the outer surface of the diaphragm 14 can be detected by the sensor.

Alternatively, the method according to the present invention can, however, also be used for producing micromechanical structures for differential pressure sensors or pressure sensor arrays.

A micromechanical structure for a differential pressure sensor can e.g. be produced by providing the cavity, which is arranged below the diaphragm-like structure, with an opening which connects the cavity to the environment. It is now possible to apply different pressures to the two sides of the diaphragm so that the output signal of the sensor defined by the cavity and the diaphragm will indicate the difference between these pressures. For producing a micromechanical structure for such a differential pressure sensor, the wafer which will not be thinned later on has formed therein one or a plurality of vertical openings, which do not fully penetrate the wafer, before the two wafers are connected. These openings can preferably be etched. When the wafers have been connected, this opening communicates directly with the sensor cavity or it may also communicate with this cavity via a channel. When the production of the micro-electromechanical element has been finished, i.e. when the integrated circuit has been integrated in the thinned wafer, this buried opening is opened through the unthinned wafer. This opening step can be carried out e.g. by a further etching process or by a thinning process from the back.

Alternatively, a differential pressure sensor can be realized by structuring two cavities with respective associated diaphragms in the intermediate layer or in the intermediate layers in accordance with the method according to the present invention, the two cavities being interconnected by one or by a plurality of vertical or lateral channels. The vertical channels, whose height is preferably lower than that of the cavities, can be produced by different structuring of an intermediate layer or by structuring a plurality of intermediate layers. Also in this case, one of the cavities is opened towards the surroundings when the integrated circuit has been produced in the wafer, so as to permit the application of a pressure to the lower surface of the diaphragm so that a differential pressure can be detected between the lower surface and the upper surface of the diaphragm. In addition, it is also possible that two or more sensors consisting each of a cavity and of an associated diaphragm drive one or a plurality of differential amplifiers.

The production of a plurality of cavities with associated diaphragms can also be used for realizing a pressure sensor array which offers a high resolution. For this purpose, e.g. a plurality of cavities are structured in a matrix side by side in one or a plurality of intermediate layers so that a pressure sensor array will be obtained when the wafers have been connected. When the micromechanical structure for the pressure sensor array has been produced in accordance with the present invention, a suitably adapted integrated circuit is produced in the thinned wafer. This integrated circuit may, for example, be adapted in such a way that it adds the sensor signals so as to increase the sensitivity of the sensors and so as to obtain a higher sensor signal. In order to achieve this, e.g. only the signal of one sensor on the matrix will be processed in the case of the highest pressure specified for the system, whereas in the case of a decreasing pressure the signal to be processed is increased by adding the signals of a plurality of sensors of the matrix. In this connection, it may become necessary that each individual sensor element has to be calibrated separately so as to avoid an addition of errors. If the integrated circuit includes a microcontroller, it will be possible to implement the system such that it is self-calibrating. A microcontroller can, for example, control an automatic zero adjustment. The sensor signal can then be read out via an integrated data output component, e.g. an $I^2C$ interface.

The method of producing a micromechanical structure according to the present invention can, in addition, also be used for producing integrated sensors which are suitable for high-temperature applications. Such high-temperature resistance of the differential pressure sensors and the pressure sensor arrays produced according to the above-described methods can be achieved e.g. by design measures, by "encapsulating" the sensitive elements; this can be achieved e.g. by a trench process module or by implementing the piezoresistors in structured polysilicon. By extending the standard process with a trench module, it will be guaranteed that an electronic circuit component or a micromechanically formed sensor will be enveloped in an insulating layer, e.g. a silicon dioxide layer.

Figure 2:
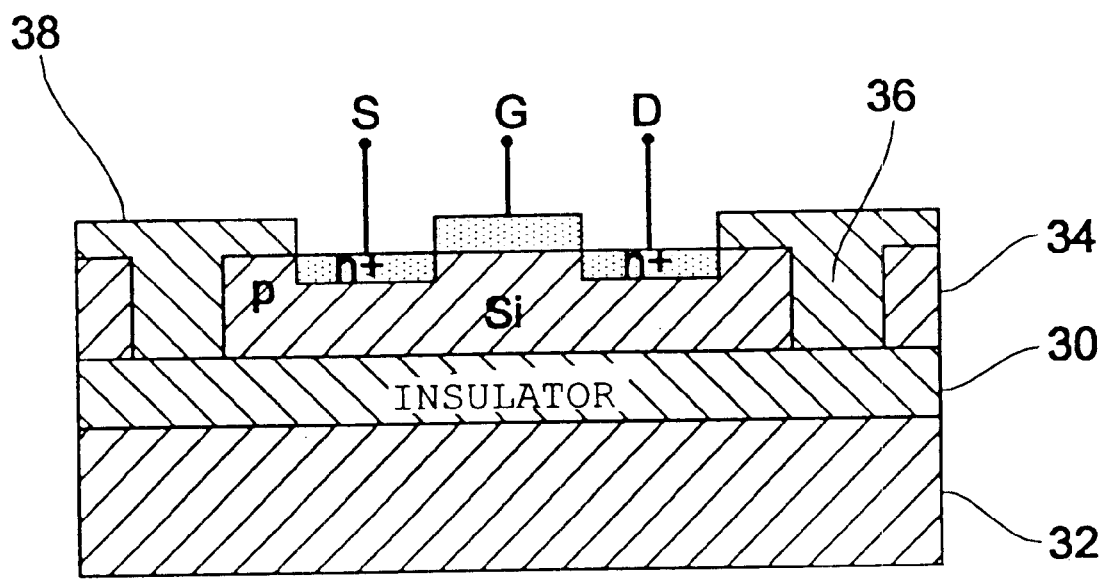
FIG. 2 shows a cross-sectional view of an electrically insulated circuit element in an SOI substrate.

Likewise, a high-temperature resistance of the integrated circuit can be achieved by design measures. The fact that the transistor is electrically insulated on all sides reduces the volume from which thermally generated minority charge carriers can diffuse into the active region and cause a higher leakage current. It follows that this measure permits the transistor to be operated also at high temperatures. FIG. 2, for example, shows a cross-sectional view of an SOI transistor which has been encapsulated by a "trench process module" and electrically insulated in this way. The electric insulation of the SOI transistor, which is schematically shown with a source terminal S, a gate terminal G and a drain terminal D in a p-type silicon layer, is formed, on the one hand, by the insulating layer 30 of the SOI substrate, which comprises a support layer 32, the insulating layer 30 and a silicon layer 34 arranged on the insulating layer. On the other hand, the SOI transistor is surrounded by trenches 36, which are referred to as "trenches" also in German and by means of which the SOI transistor is electrically insulated. On the surface of the silicon layer 34 a passivation layer 38 is provided, which is applied either when the trenches 36 are being filled or subsequently to this filling step.

It follows that the present invention provides methods of producing micromechanical structures for micro-electromechanical elements in the case of which all the cavities of the micromechanical structures are hermetically sealed after their production, and a planar surface which is closed at the top is provided so that the wafers can be processed from above making use of conventional CMOS technologies. Problems entailed by conventional methods due to the cleaning of wafer surfaces and the ingress of liquids into cavities as well as due to the carrying over of particles and contaminations are therefore eliminated by the method according to the present invention. Hence, the present invention provides a method which requires little expenditure and which permits the production of micromechanical elements at a reasonable price and with a high yield.

What is claimed is:

1. A method of producing a micromechanical structure for a micro-electromechanical element comprising the following steps:

a) structuring a first intermediate layer, which is applied to a first main surface of a first semiconductor wafer, so as to produce a recess;

b) connecting the first semiconductor wafer via the first intermediate layer to a second semiconductor wafer in such a way that a hermetically sealed cavity is defined by the recess; and c) thinning one of the wafers from a surface facing away from said first intermediate layer so as to produce a diaphragm-like structure on top of the cavity, further comprising the step of providing at least one further intermediate layer between the two semiconductor wafers, which, prior to the connection of the two semiconductor wafers, is structured in such a way that the structure formed in said at least one further intermediate layer and the recess in said first intermediate layer define a cavity with areas of variable height.

2. The method according to claim 1, wherein the main surface of the second semiconductor wafer, which is connected to the first semiconductor wafer via the intermediate layer, has applied thereto an intermediate layer prior to the connecting step.

3. The method according to claim 2, wherein the intermediate layer applied to the second semiconductor wafer is structured in such a way that, after the connecting step, the structure formed in the second intermediate layer and the recess in the first intermediate layer define the cavity.

4. The method according to claim 1, wherein the first and the second wafer (2, 8) consist of silicon.

5. The method according to claim 1, wherein said intermediate layers (4, 10) consist of an oxide, a polysilicon, a nitride or of tetraethylorthosilicate.

6. The method according to claim 1, wherein said intermediate layers are structured in such a way that, after the connection of the two wafers, a plurality of cavities is defined, said cavities being interconnected by channels and hermetically sealed from their surroundings.

7. The method according to claim 1, wherein, after step c), an integrated circuit is produced in the thinned semiconductor wafer.

8. The method according to claim 7, wherein the integrated circuit is produced making use of standard semiconductor processes.

9. The method according to claim 1, wherein electrically insulating trenches are formed in the thinned semiconductor wafer so as to produce in said thinned semiconductor wafer areas which are electrically insulated from one another.

10. The method according to claim 1, wherein the connection in step b) is carried out in a vacuum.

11. The method according to claim 1, wherein an SOI wafer is used as a first and/or second water.

12. The micro-electromechanical element produced in accordance with a method according to claim 1, comprising a first semiconductor layer;

at least one intermediate layer which is applied to a first main surface of the first semiconductor layer and which is provided with a recess;

a second thinned semiconductor layer which is arranged on top of said intermediate layer in such a way chat a diaphragm-like structure is formed on top of the recess;

an integrated CMOS circuit (16) in said thinned semiconductor wafer (2); and at least one further intermediate layer which is arranged between the two semiconductor layers (2, 8) and structured in such a way that the structure formed in said at least one further intermediate layer and the recess in said first intermediate layer define the cavity.

* * * * *